United States Patent [19]

Pinchott

[11] Patent Number: 4,959,707
[45] Date of Patent: Sep. 25, 1990

[54] ROTATING RECTIFIER ASSEMBLY
[75] Inventor: Gordon A. Pinchott, Rockford, Ill.
[73] Assignee: Sundstrand Corporation, Rockford, Ill.
[21] Appl. No.: 338,037
[22] Filed: Apr. 14, 1989
[51] Int. Cl.⁵ .......................... A01L 25/14; A01L 25/06
[52] U.S. Cl. ........................................ 357/76; 357/75; 357/82; 357/81
[58] Field of Search ....................... 357/76, 74, 82, 81, 357/75, 68, 79; 310/68 R, 68 D, 72

[56] References Cited
U.S. PATENT DOCUMENTS

| 4,554,574 | 11/1985 | Wright | 357/74 |
| 4,570,094 | 2/1986 | Trommer | 310/68 R |
| 4,583,005 | 4/1986 | Bevans | 310/68 D |
| 4,603,344 | 7/1986 | Trommer | 310/68 D |
| 4,628,219 | 12/1986 | Troscinski | 310/68 D |
| 4,745,315 | 5/1988 | Terry Jr. et al. | 310/68 D |
| 4,799,309 | 1/1989 | Cinzori et al. | 310/68 D |

Primary Examiner—Rolf Hille
Assistant Examiner—S.V. Clark
Attorney, Agent, or Firm—Antonelli, Terry, Stout & Kraus

[57] ABSTRACT

A rotating rectifier assembly which can be used in a brushless electrical generator comprises an arrangement for supporting diode semiconductor devices in an axially loaded assembly of components within a housing of the rectifier assembly without compressively loading the diode semiconductor devices themselves. Provision is made for flowing liquid coolant in direct contact with the diode semiconductor devices and for the escape of air which is centrifugally separated from the liquid coolant during high speed rotation of the rectifier assembly. The rectifier assembly is compact, light weight and highly reliable.

20 Claims, 5 Drawing Sheets

ROTATING RECTIFIER ASSEMBLY

Technical Field

The present invention is directed to an improved rectifier assembly and a method of making the same. More particularly, the invention relates to an improved rotating rectifier assembly and a method of making the same, the rectifier assembly being adapted to be disposed in a rotor, as, for example, a generator rotor, and to be rotated at high speed therewith.

Background Art

It is known to employ rotating rectifier assemblies in generators, such as high speed generators utilized in aircraft. The use of rotating rectifier assemblies permits the elimination of brushes which frequently require maintenance and/or replacement.

A typical brushless generator has three distinct generating systems, including a main generator, an exciter and a permanent magnet generator. The permanent magnet generator includes permanent magnets for establishing a magnetic field which is employed to induce a current field in a set of windings. This induced current is in turn employed to generate a magnetic field in the exciter; and this magnetic field in turn is employed to induce an even higher level of current, typically three phase alternating, which is then employed to generate a magnetic field for the main generator.

In order to avoid the use of brushes, it is necessary that the magnetic field and the main generator be in the rotor so that the output of the system can be taken from the stator of the main generator. To generate a suitable magnetic field in the rotor, it is necessary to utilize direct current, as opposed to alternating current. Since the output of the exciter is an alternating current, this current must rectified to direct current. A rectifier assembly is used for this purpose. In order to avoid resort to brushes, it is necessary that the rectifier assembly interconnecting the exciter and the main generator field winding be carried by the rotor of the generator. U.S. Pat. Nos. 4,570,094; 4,603,344 and 4,628,219 disclose examples of known rotating rectifier assemblies.

Rotating rectifier assemblies carried in a rotor of a generator are subjected to high centrifugal loading so that much care must be taken to assure that the components of the rectifier are adequately supported against such forces. For example, some rectifiers must be designed to withstand speeds as high as 30,000 rpm. The diode semiconductor devices used in the rectifier assemblies also dissipate power in the form heat during their use. Without proper attention to cooling, the diode semiconductor devices will fail. In the known rotating rectifier assemblies of the aforementioned U.S. patents, the diode semiconductor devices and other assembly components are compressed in a direction along the axis of rotation of the rectifier assembly for maintaining good electrical contact and for maintaining contact of the diode wafers with adjacent heat sinks, the cooling of the diode semiconductor devices being accomplished by circulation of a coolant in contact with the heat sinks.

In aircraft generating systems, in addition to the usual reliability concerns, size and weight restrictions are significant. The compactness, or lack thereof, of the rotor will dictate certain bearing and housing size selections, and thus affect the weight of the system. Since the rotating rectifier assembly forms part of the rotor and therefore influences its size, every effort is made to minimize its size and weight.

Disclosure Of Invention

An object of the present invention is to provide an improved rotating rectifier assembly and a method of making the same which overcome one or more of the aforementioned problems. More particularly, an object of the invention is to provide a new and improved rotating rectifier assembly which is highly reliable and of a relatively small size and weight.

A further object of the invention is to provide an improved rotating rectifier assembly wherein the diode semiconductor devices are adequately supported against high centrifugal loading which occurs during rotation of the rectifier assembly, while at the same time the diode semiconductor devices are relieved of compressive stresses on the other components of the rectifier assembly due to axial preloading of the assembly.

Another object of the invention is to provide an improved rectifier assembly and a method of making the same wherein effective, direct cooling of the diode semiconductor devices is accomplished to prevent premature failure of the devices.

These and other objects are obtained by the rotating rectifier assembly of the invention which comprises a plurality of components arranged along an axis of rotation of the assembly and means for forcing the components together in a direction along the axis, wherein means are provided for supporting at least one diode semiconductor device on at least one component of the assembly such that the axial force on the components from the means for forcing is not transmitted to the at least one diode semiconductor device. Relieving the compressive stresses on the diode semiconductor devices, particularly where the diode semiconductor devices are subjected to centrifugal loading during high speed rotation, reduces the likelihood of stressrelated failures of the diode semiconductor devices.

The improved rotating rectifier assembly of the invention is further characterized by the provision of means for flowing liquid coolant through the rectifier assembly in direct contact with the at least one diode semiconductor device for cooling the device. The rotating rectifier assembly acts as a centrifuge for the liquid coolant when it is rotating. It has been found that, because of the hydrodynamics during rotation, gas, normally air, is separated from the liquid coolant, typically oil, and centrifuged to the center of the rectifier assembly. This can reduce cooling efficiency by preventing liquid contact with surfaces to be cooled. The rectifier assembly of the invention avoids this problem by providing means located along the axis of rotation of the rectifier assembly for escape of the separated gas from the assembly.

In a disclosed, preferred form of the invention, the rotating rectifier assembly comprises a generally tubular housing; and at least one diode subassembly arranged within the housing, the subassembly including at least one diode semiconductor device, a support affixed to one side of the at least one semiconductor device and connector means affixed to an opposite side of the at least one semiconductor device. The at least one diode semiconductor device is preferably affixed to the support and the connector means by solder.

The support in the disclosed embodiment is in the form of a plate which extends transverse to the axis of rotation of the rectifier assembly. Means are provided for coupling the at least one diode subassembly for rotation with the housing of the assembly. In a disclosed form of the invention this means includes a tab on the support plate which is received within a cooperating groove on the interior of the housing. The rectifier assembly further comprises means for axially positioning the at least one diode subassembly in the housing without compressively loading the at least one semiconductor device. As a result of this arrangement, the at least one diode semiconductor device is firmly supported within the housing while not being compressed by an axial loading on the other components of the assembly.

Passage means are provided in the rectifier assembly for circulating a liquid coolant through the rectifier assembly for direct cooling of the at least one semiconductor device. As an additional feature of the invention, the support of the aforementioned at least one diode subassembly is provided with a hole therethrough on the axis of rotation of the rectifier assembly to allow escape of gas which is centrifugally separated from the liquid coolant during rotation of the rectifier assembly. An additional component of the rectifier assembly, a resistor in the disclosed embodiment, is located on the axis of rotation of the rectifier assembly within the assembly housing and adjacent the at least one diode subassembly At least one of the support and the additional component are provided with a radially directed slot formed therein in communication with the whole in the support The slot serves as a passageway for gas centrifugally separated from the liquid coolant to move to the hole in the support and escape the assembly.

The diode subassembly in the disclosed form of the invention comprises a plurality of diode semiconductor devices which are each located in one of a plurality of spaced locations on the support for rectifying respective phases of a multi-phase alternating current, specifically, three spaced locations are employed for rectifying a three-phase alternating current input to the rectifier assembly. Insulating means extend between the support and the connector means for physically and electrically separating the diode semiconductor devices of the respective spaced locations. The connector means comprise a plurality of thin connector plates associated with respective ones of the plurality of spaced locations. Electrical terminal means are provided on each of the connector plates for connecting respective electrical conductors to the connector plates for inputting respective phases of the alternating current to the diodes of the diode subassembly.

Further, according to the preferred embodiment, the rectifier assembly comprises a pair of the diode subassemblies which together form a full wave bridge rectifier for taking input, three phase alternating current and outputting direct current voltage. The pair of diode subassemblies are arranged within the housing of the rectifier assembly in spaced relation along the axis of rotation of the rectifier assembly by means of a separator located between the subassemblies. The connector means of each of the pair of subassemblies face one another in spaced relation. The connector means and the diode semiconductor devices of the subassemblies have spaces formed therein through which respective ends of the separator extend such that the separator ends abut the respective supports of the subassemblies for preventing compressive loading of the diode semiconductor devices while the components within the housing are axially locked. For this latter purpose the rotating rectifier assembly further includes means for resiliently biasing the pair of subassemblies toward one another and against the separator. The separator is formed of an insulating material and has a shape such that it also physically and electrically separates the diode semiconductor devices and portions of the connector means on each subassembly, in the respective spaced locations from one another. Means are also provided for preventing relative rotation of the separator and the subassemblies.

From the above discussion of the improved rotating rectifier assembly of the invention, it can be seen that the method of making a rotating rectifier assembly according to the invention comprises the steps of axially loading components of a rotating rectifier assembly which are arranged within a generally tubular housing of the rectifier assembly, while supporting diode semiconductor devices of the rotating rectifier assembly within the housing and in relation to the other components of the rectifier assembly so that the diode semiconductor devices are not compressed by the axial loading of the components, whereby compressive stresses on the diode semiconductor devices due to the axial loading of the components are avoided. Further, according to the method, liquid coolant is flowed through the rectifier assembly in direct contact with the diode semiconductor for cooling the devices. As an additional step of the method, gas which is centrifugally separated from the cooling liquid during rotation of the rectifier assembly is permitted to escape from the rectifier assembly through passage means located along the axis of the rectifier assembly.

These and other objects, features and advantages of the present invention will become more apparent from the following description when taken in connection with the accompanying drawings, which show, for purposes of illustration only, one preferred embodiment in accordance with the present invention.

Best Mode For Carrying Out The Invention

Figure 18:
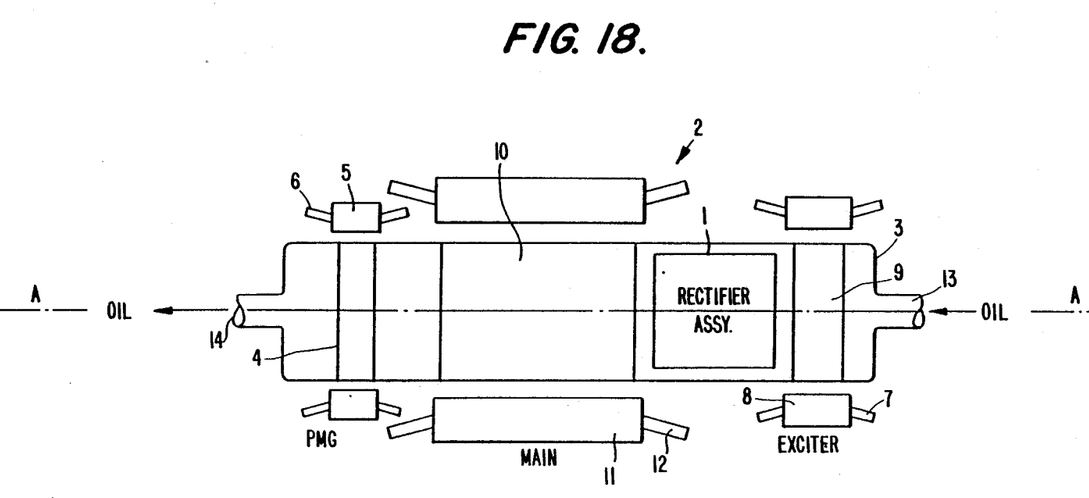
FIG. 18 is a schematic side elevation of a brushless generator with which the rotating rectifier assembly of the invention may be used.

Referring now to the drawings, a rotating rectifier assembly 1 of the invention is shown schematically in a position of use in a brushless rotary electric generator 2 as shown in FIG. 18. The brushless generator includes an elongated shaft 3 journalled by any suitable means and carrying a series of permanent magnets 4 thereon. A stator 5 provided with windings 6 surrounds the magnets 4 and defines a permanent magnet generator therewith. Electrical current generated in the windings 6 during rotation of the shaft 3 is provided via suitable conductors to windings 7 in an exciter stator 8. Axially aligned with the exciter stator 8 and carried by the shaft 3 are windings 9 in which current will be induced during rotation of the shaft.

The current induced in the windings 9 is fed to the rectifier assembly 1 contained within the shaft where it is rectified to direct current, from the three-phase alternating current supplied to the rectifier assembly. Direct current from the rectifier 1 is then fed to a main field winding 10 carried by the shaft 3. The main field winding is and rotatable in alignment with a main generator stator 11. The stator 11 includes windings 12 in which an alternating current is induced and which, by suitable conductors not shown, the windings may be connected to suitable loads. An engine, such as an aircraft engine, can be used to rotate the shaft 3 of the brushless generator 2 for generating AC electrical power. During this rotation the rectifier assembly 1 and shaft 3 are rotated about the axis A—A at high speeds, for example up to 30,000 rpm.

The shaft 3 is provided with an oil inlet 13 and an oil outlet 14 at its opposite ends for cooling the generator 2. Oil introduced into the shaft is used for cooling the windings 9 and 10 as well as the rectifier assembly 1 and may be used for lubrication purposes in connection with bearings rotatably supporting the shaft 3.

Figure 1:
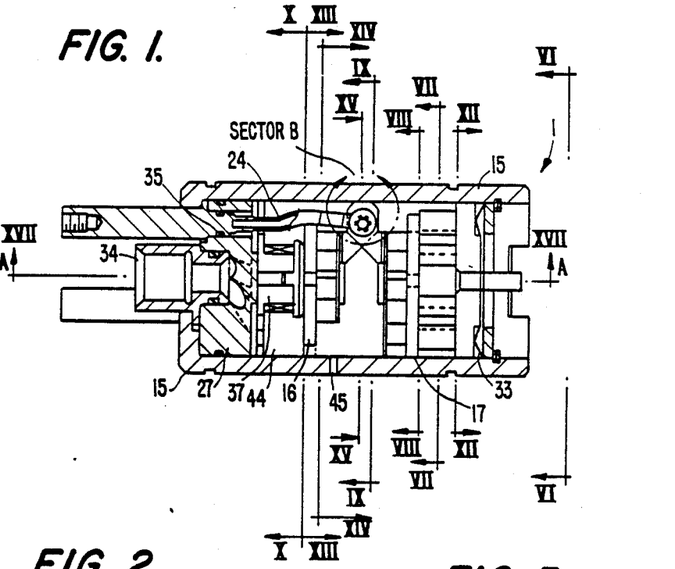
FIG. 1 is a cross-sectional view of a rotating rectifier assembly according to a preferred embodiment of the invention taken along the line I—I of the rectifier assembly as depicted in FIG. 2, the cross-section being through the longitudinal axis A—A of the rectifier assembly about which the assembly is adapted to be rotated when located in a brushless generator as illustrated in FIG. 18.
Figure 2:
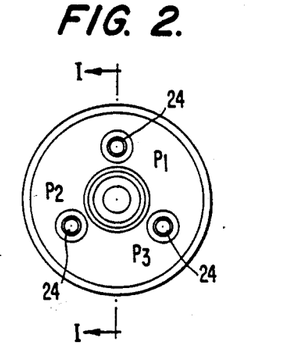
FIG. 2 is an end view of the left end of the rectifier assembly of FIG. 1.
Figure 3:
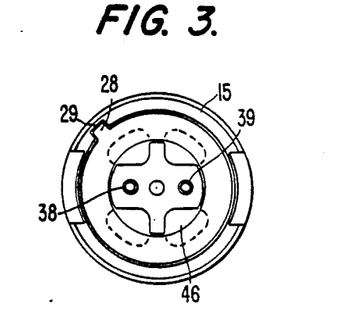
FIG. 3 is an end view of the right end of the rectifier assembly of FIG. 1.
Figure 5:
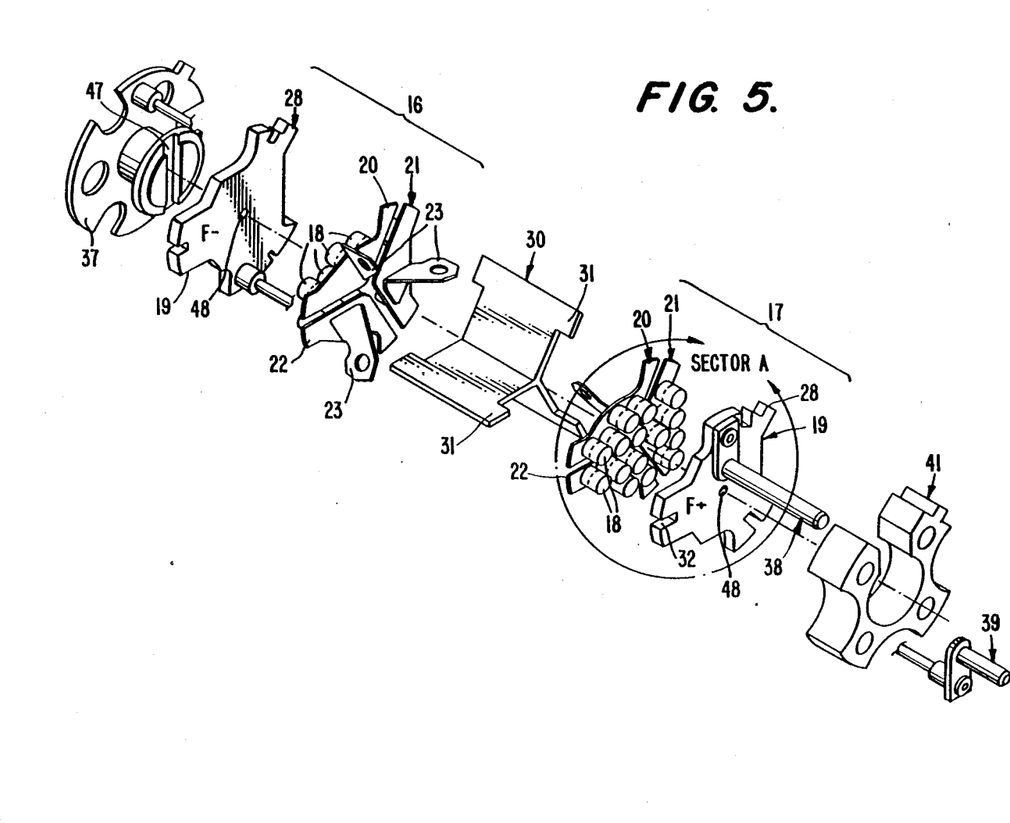
FIG. 5 is an exploded view of the diode assembly of the rectifier assembly of FIG. 1.
Figure 6:
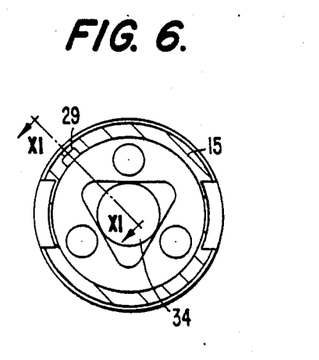
FIG. 6 is an end view of the tubular housing of the rectifier assembly taken along the line VI—VI of FIG. 1.
Figure 7:
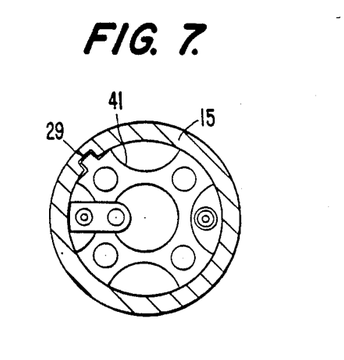
FIG. 7 is a sectional view of the rectifier assembly taken along the line VII—VII of FIG. 1 through a spacer of the diode assembly.
Figure 8:
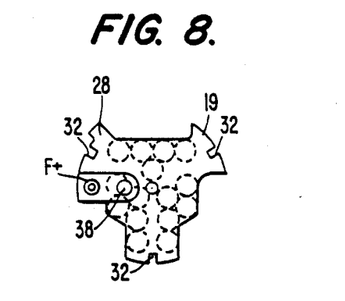
FIG. 8 is a sectional view taken along the line VIII—VIII of FIG. 1 illustrating the F+ plate of the diode assembly, but not the surrounding housing.
Figure 9:
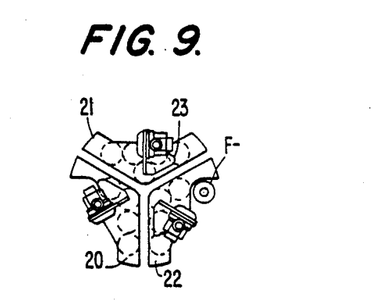
FIG. 9 is a sectional view taken along the line IX—IX of FIG. 1 showing the diode plates of the diode assembly, the housing not being shown.
Figure 10:
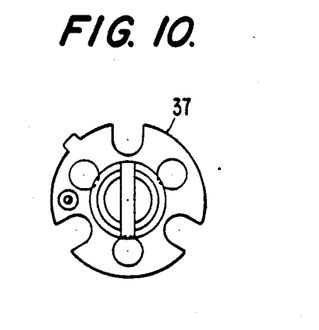
FIG. 10 is sectional view taken along the line X—X of FIG. 1 depicting the resistor plate of the assembly, the surrounding housing not being illustrated.
Figure 11:
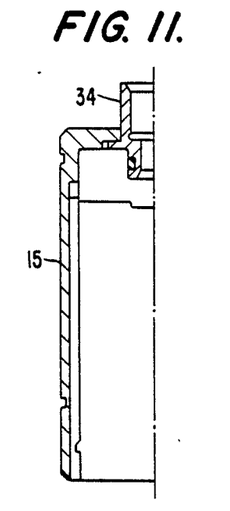
FIG. 11 is a sectional view of one half of a tubular housing taken along the line XI—XI of FIG. 6.
Figure 12:
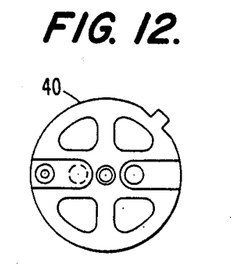
FIG. 12 is a sectional view taken along the line XII—XII of FIG. 1 and showing the DC terminal support, the surrounding tubular housing not being illustrated.
Figure 13:
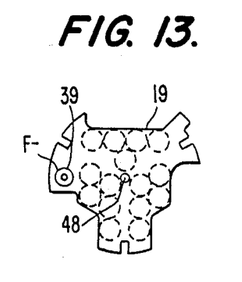
FIG. 13 is a sectional view taken along the line XIII—XIII of FIG. 1 and depicting the F— plate of the diode assembly, the tubular housing of the rectifier assembly not being shown.
Figure 14:
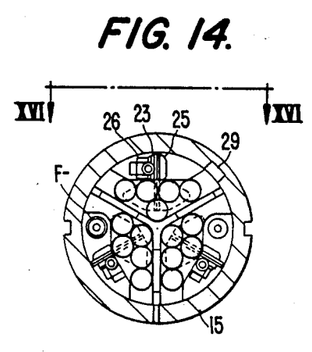
FIG. 14 is a sectional view taken along the line XIV—XIV of FIG. 1 and illustrating the diode plates associated with the diode subassembly which includes the F— plate.
Figure 15:
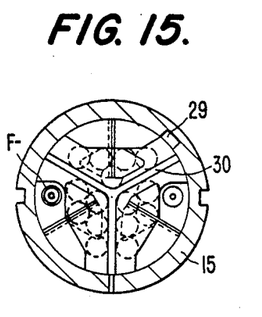
FIG. 15 is a sectional view taken along the line XV—XV of FIG. 1 and showing the diode plates and spacer.
Figures 16, 17:
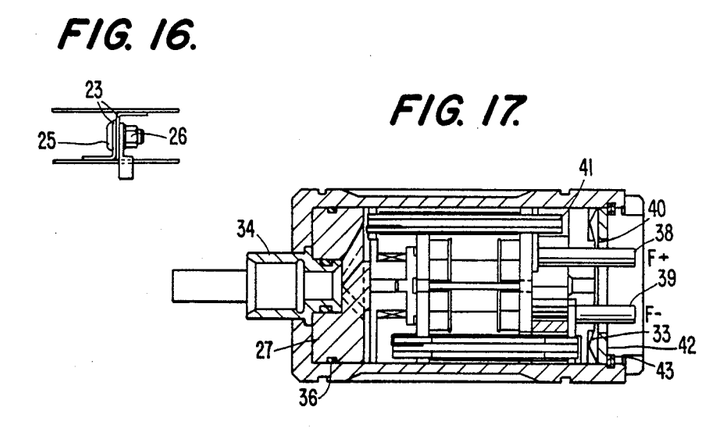
FIG. 16 is a side view of the diode plates, ring terminals connected thereto and connecting screw and nut joining the terminals to each other and a current carrying wire.
FIG. 17 is a cross-sectional view of the rotating rectifier assembly taken along the line XVII—XVII of FIG. 1.

Referring to FIGS. 1, 5 and 17, it can be seen that the rotating rectifier assembly 1 of the invention comprises generally a tubular housing 15 having a pair of diode subassemblies 16 and 17 arranged within the housing 15 for rotation therewith.

Sector A in the exploded view of FIG. 5 shows the diode subassembly 17. The subassembly comprises an array of a plurality of individual diode semiconductor devices 18 to which are affixed on opposite sides of diode semiconductor devices 18 a thick base plate 19, and thin top connector plates 20, 21 and 22. Each of the diode semiconductor devices 18 is encapsulated in glass to allow a liquid coolant to come into intimate contact with diode semiconductor devices for cooling purposes as discussed hereinafter The respective ends of the diode semiconductor devices 18 are preferably fixed to the base plate 19 and the connector plates 20, 21 and 22 by soldering. The base plate is conductive. Illustratively, it can be formed of oxygen-free copper plated with silver. The thickness of the base plate in the disclosed embodiment is $0.102 \pm 0.002$ inch and its outer diameter is such that it can fit within the tubular housing 15 which has an inside diameter of $1.250 \pm 0.002$ inches with the base plate extending perpendicular to the rotational axis A—A of the housing 15 and assembly 1.

The thin top connector plates 20, 21 and 22 are also formed of a conductor material, e.g. beryllium copper plated with silver, have a thickness of 0.020 inch, for example, and are sized to fit within the tubular housing 15. The diode semiconductor devices 18 are arranged in three groups at spaced locations on the base plate 19. Five diodes in parallel, for current carrying capability, are located in each group or location. Linear, radially outwardly directed spaces are formed between the respective groups of the diode semiconductor 18 as arrayed on the base plate 19. The connector plates 20, 21 and 22 are connected to respective groups of the diode semiconductor devices 18 with the connector plates also being spaced from one another by the linear, equiangular and radially directed spaces which are coincident with the spaces between the groups of diode semiconductor devices 18 on the base plate 19.

Figure 4:
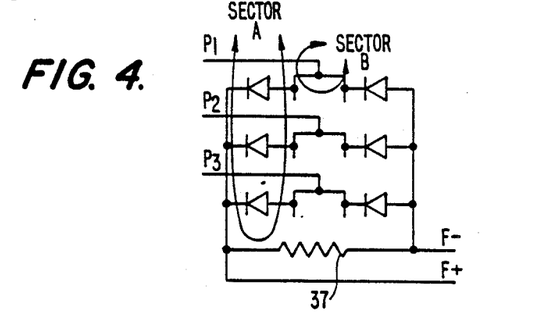
FIG. 4 is an electrical schematic diagram of the rectifier assembly according to the preferred form of the invention.

The diode subassembly 17 of sector A forms half of the full wave bridge rectifier of the assembly 1, see also the electrical schematic of FIG. 4. The diode subassembly 16 forms the other half of the full wave bridge. The diode subassembly 16 has a construction like that of the diode subassembly 17, but it faces in an opposite direction within the tubular housing 15 as compared with the diode subassembly 17.

Ring tongue terminals 23 are affixed as by soldering to the surfaces of the respective connector plates 20, 21 and 22 of each subassembly on the sides of the connector plates opposite those affixed to the diode semiconductor devices 18. The ring tongue terminals 23 are AC terminals to which AC leads 24 from a source external to the housing 15 of the assembly 1 are connected by a bolt 25 and nut 26 for making electrical connection to the thin top connector plates and, in turn, the diode devices 18. Particularly, as shown in FIGS. 1, 9, 14 and 16, a flexible AC lead 24 is interposed between an AC terminal support housing 27 and the top connector plates of two diode subassemblies which face each other to accomplish the full wave bridge, see sector B in FIGS. 1 and 4. Bolts and nuts are preferred for making the connections between the flexible leads and the ring tongue terminals to avoid distortion to the thin top connector plates and to simplify disassembly.

Each base plate 19 of the subassemblies 16 and 17 is piloted within the internal diameter of the housing 15 and positioned therein by means of a tab 28 which engages in a slot 29 integral to the housing 15. This arrangement prevents relative rotation between the subassemblies 16 and 17 and the tubular housing 15. The tabs of the ring tongue terminals affixed to each top connector plate through which the bolts 25 extend, are formed such that they are close to the internal diameter of the housing 15 for purposes of radial support.

The rotating rectifier assembly 1 further comprises a separator 30 formed of an insulating material, e.g. a polyamide-imide plastic such as Torlon by Amoco. The separator 30 fits in the spaces between the thin top connector plates 20, 21 and 22 and the groups of diode semiconductor devices 18, such that the ends of the separator 30 are positioned against the base plates 19 of the respective subassemblies 16 and 17. Each of the three legs of the separator is configured with an integral tab 31 which fits into an associated slot 32 in the base plates 19 of each of the diode subassemblies 16 and 17. This arrangement provides a positive drive to the separator when the assembly 1 is rotating. The solid, continuous form of the separator 30 also enables the separator to isolate, both physically and electronically, the three phases of the alternating current conducted to the respective groups of diode semiconductor devices from each other. Each end of the separator 30 comes in contact with the base plate 19 of one of the opposed diode subassemblies. In this manner the separator 30 also transmits the compressive stresses on the components of the diode assembly due to an axial force on the components within the housing 15 caused by a wave spring 33. The separator 30 thereby enables the components to be compressed without loading the diode semiconductor devices 18 with the force from spring 33.

The AC terminal support housing 27 is positioned at the closed end of the housing 15 and locates the AC leads 24 and an oil transfer tube 34. Preformed packings 35 and 36 are located between the oil transfer tube 34 and the AC terminal 27 and between the periphery of the AC terminal support 27 and the internal diameter of the housing 15 for sealing against leakage of a coolant, typically oil, which is circulated through the assembly 1, the oil transfer tube 34 constituting an inlet for the coolant to the assembly 1. Illustratively, the AC terminal support housing 27 can be formed of an insulating material, e.g. a polyamide-imide plastic such as Torlon by Amoco.

A suppression resistor 37 fits within the housing 15 between the AC terminal support housing 27 and the base plate 19 of the diode subassembly 16. As seen from the electrical schematic diagram showing the basic circuit of the rotating rectifier assembly 1 of the invention, the rectifier assembly is a full wave bridge rectifier which takes input three phase AC voltage at $P_1$, $P_2$ and $P_3$ and outputs DC voltage at F+ and F−. This is accomplished by the described arrangement of the diode semiconductor devices 18. The suppression resistor 37 as shown in this diagram serves to protect against reverse voltage transients.

At the opposite end of the rectifier assembly 1, a pair of DC termination pins 38 and 39, which are electrically connected to the respective base plates 19 of the subassemblies 16 and 17, are held in place by a DC terminal support housing 40. A spacer 41, which has been scalloped for oil flow, as discussed hereinafter, is included to give the diode assembly, that is, the assembly of the components within the tubular housing 15, its proper internal length for the housing 15 into which it is installed. The wave spring 33 and a spring seat 42 are located between a snap ring 43 and the DC terminal support housing 40. As previously indicated, an axial force caused by the wave spring 33 compresses the components of the diode assembly within the housing 15 to retain them in a fixed axial position within the housing during high speed rotation of the rectifier assembly 1.

The rotating rectifier assembly 1 is also configured to allow free flow of coolant oil around all of the diode semiconductor devices 18, the base plates 19 and the thin top connector plates 20, 21 and 22 of each diode subassembly 16 and 17, and also the resistor 37. Specifically, oil enters the housing 15 by means of the oil transfer tube 34 and is distributed through passages in the AC terminal support housing 27 to the cavity 44 surrounding the resistor 37. From the cavity 44, the liquid coolant progresses axially to surround the base plates 19, thin top connector plates 20, 21 and 22 and diode semiconductor devices 18. A small amount of oil passes radially through a bleed hole 45 and the remainder continues axially through the rectifier assembly 1 until it exits the end opposite to its entrance through a central aperture 46 in the DC terminal support housing 40.

The rectifier assembly 1 acts as a centrifuge when it is rotating The hydrodynamics during rotation are such that the oil is forced to the inside diameter of the housing 15 and air will be subsequently centrifuged to the center. According to the invention, a passageway for this air is included along the axis of rotation A-A through the rectifier assembly to allow escape of the air from the assembly. For this purpose, a slot 47 is formed in the small end of the suppression resistor 37 to connect the cavity 44 around the resistor with a hole 48 in the center of the base plate 19 of the diode subassembly 16. The path of the air continues around the center of the separator 30 and through a hole 48 in the center of the base plate 19 of the diode subassembly 17. Air then travels through the spacer 41 and the aperture 46 of the DC terminal support housing 40 and exits the rectifier assembly 1 through a suitable fitting, not shown, which makes electrical connection with the DC termination pins 38 and 39 at the end of the rectifier assembly For example, the DC termination pins 38 and 39 can be slidably connected to a female connector which receives the pins for quick attachment and disconnect to the rectifier assembly 1.

From the above detailed description of the preferred embodiment of the invention, it can be seen that the method of axial loading of the components of the rotating rectifier assembly arranged within the tubular housing of the rectifier assembly includes the step of supporting the diode semiconductor 18 of the rotating rectifier assembly within the housing 15 and in relation to the other components of the rectifier assembly so that the diode semiconductor devices are not compressed by the axial loading of the other components by the wave spring 33 whereby compressive stresses on the diode semiconductor devices due to the axial loading of the components are avoided. This is accomplished while securely supporting the diode semiconductor devices 18 within the housing against centrifugal forces from high speed rotation of the rectifier assembly about the axis of A-A thereof. The method of the invention further comprises the step of flowing liquid coolant through the rectifier assembly such that the coolant is in direct contact with the diode semiconductor devices 18 for optimizing cooling of the devices. The cooling is further enhanced in that air which may be centrifugally separated from the liquid coolant during rotation of the rectifier assembly is permitted to escape from the rectifier assembly through passage means provided along the axis of rotation of the rectifier assembly. This insures that liquid coolant remains in contact with the diode semiconductor devices 18 for enhanced cooling. Each of these features and their combination contribute to an improved reliability of the rotating rectifier assembly by reducing the risk of early failure of the wafers of the diode semiconductor devices due to stresses and/or overheating.

While I have shown and described only one embodiment in accordance with the present invention, it is understood that the same is not limited thereto, but is susceptible to numerous changes and modifications as known to those skilled in the art. For example, the rotating rectifier assembly and method of the invention are not limited to the use with full wave bridge rectifiers, but could be used with other arrangements, for example, with half wave rectification, still providing the aforementioned advantages of the invention in a rectifier assembly which is compact, light weight and highly reliable. Therefore, I do not wish to be limited to the details shown and described herein, but intend to cover all such changes and modifications as are encompassed by the scope of the appended claims.

I claim:

1. A rotating rectifier assembly comprising:
    a generally tubular housing;
    at least one diode subassembly including at least one diode semiconductor device, a support means affixed to the at least one semiconductor device and at least one connector affixed to an opposite end of said at least one semiconductor device; and
    means for axially positoining the at least one diode subassembly in the housing without compressively loading said at least one diode semiconductor device.

2. A rotating rectifier assembly according to claim 1, further comprising means for flowing coolant through said housing such that the coolant directly contacts said at least one diode semiconductor device.

3. A rotating rectifier assembly according to claim 1, wherein said support means and said at least one connector are affixed to the at least one diode semiconductor device by solder.

4. A rotating rectifier assembly according to claim 1, wherein said support extends transverse to an axis of the rectifier assembly about which the rectifier assembly is adapted to be rotated.

5. A rotating rectifier assembly according to claim 1, wherein means are provided for coupling the at least one diode subassembly with said housing for rotation with said housing.

6. A rotating rectifier assembly comprising:
    a generally tubular housing;
    at least one diode subassembly arranged within said housing, said subassembly including at least one diode semiconductor device, a support means affixed to the at least one semiconductor device and at least one connector affixed to an opposite end of said at least one semiconductor device, wherein means are provided for circulating a liquid coolant through said rectifier assembly for cooling said at least one diode semiconductor device and wherein said support means is provided with a hole therethrough on an axis of rotation of the rectifier assembly to allow escape of gas which is centrifuged out of the liquid coolant during rotation of the rectifier assembly.

7. A rotating rectifier assembly according to claim 6, wherein an additional component of the rectifier assembly is located on the axis of rotation of the rectifier assembly within the housing and adjacent the support means of said at least one diode subassembly, at least one of the support means and the additional component having a radially directed slot formed therein in communication with said hole in the support means to form a passageway for gas to escape.

8. A rotating rectifier assembly according to claim 7, wherein said additional component is a resistor and said slot is formed in said resistor.

9. A rotating rectifier assembly according to claim 1, wherein said at least one diode semiconductor device comprises a plurality of diode semiconductor devices each of which is located in one of a plurality of spaced locations on the support means for rectifying respective phases of a multi-phase alternating current input to the rectifier assembly.

10. A rotating rectifier assembly according to claim 9, wherein insulating means extend between said support means and said connector for physically and electrically separating the diode semiconductor devices of the respective spaced locations.

11. A rotating rectifier assembly according to claim 9, wherein said connector at least one comprises a plurality of connector plates associated with respective ones of said plurality of space locations for rectifying respective phases of a multi-phase alternating current input to said rectifier assembly.

12. A rotating rectifier assembly comprising:
    a generally tubular housing;
    at least one diode subassembly arranged within said housing, said subassembly including at least one diode semiconductor device, a support means affixed to the at least one semiconductor device and at least one connector affixed to an opposite end of said at least one semiconductor device, wherein said at least one diode semiconductor device comprises a plurality of diode semiconductor devices each of which is located in one of a plurality of spaced locations on the support means for rectifying respective phases of a multi-phase alternating current input to the rectifier assembly, wherein said at least one connector comprises a plurality of connector plates associated with respective ones of said plurality of spaced locations for rectifying respective phases of a multi-phase alternating current input to said rectifier assembly, and wherein electrical terminal means are provided on each of said connector plates for connecting respective electrical conductors to the connector plates for inputting respective phases of alternating current to the diodes of the diode subassembly.

13. A rotating rectifier assembly comprising:
    a generally tubular housing;
    at least one diode subassembly arranged within said housing, said subassembly including at least one diode semiconductor device, a support means affixed to the at least one semiconductor device and at least one connector affixed to an opposite end of said at least one semiconductor device, wherein said rectifier assembly comprises a pair of said diode subassemblies which are arranged in spaced relation along an axis of rotation of the rectifier assembly by means of a separator located between said subassemblies.

14. A rotating rectifier assembly according to claim 13, wherein the connector means of the pair of subassemblies face one another in spaced relation, said connector means and said diode semiconductor devices of the subassemblies having spaces formed therein for receiving respective ends of said separator so that said separator ends abut the supports of the subassemblies for preventing compressive loading of said diode semiconductor devices.

15. A rotating rectifier assembly according to claim 13, wherein means are provided for resiliently biasing said pair of subassemblies toward one another and against said separator.

16. A rotating rectifier assembly according to claim 13, wherein each subassembly includes a plurality of diode semiconductor devices each of which is located in one of a plurality of spaced locations between their associated supports and connector means, and wherein said separator is formed of an insulating material for physically and electrically separating the locations of the diode semiconductor devices and respective portions of the connector means of each subassembly from one another.

17. A rotating rectifier assembly according to claim 13, wherein means are provided for preventing relative rotation of the separator and the subassemblies.

18. Rotating rectifier assembly according to claim 13, wherein terminal means are provided on the connector means of each of the diode subassemblies for connecting electrical conductors to the connector means for inputting alternating current to the diode semiconductor devices of the subassemblies.

19. A rotating rectifier assembly comprising a generally tubular housing, a pair of diode subassemblies arranged within the housing, said subassemblies being located in spaced relation along an axis of rotation of the rectifier assembly, by way of a separator which extends between said subassemblies, each of said subassemblies comprising a base plate and a plurality of diode semiconductor devices which are fixed to the base plate in a plurality of spaced locations thereon, portions of said separator extending into the spaces between the plurality of locations of the diode devices, and contacting the base plates of the subassemblies for spacing said subassemblies without compressively loading the diode semiconductor devices on the base plates when said subassemblies are biased toward one another.

20. In a rotating rectifier assembly comprising a plurality of components which are arranged along an axis of rotation of the assembly and means for forcing said components together in a direction along said axis, the improvement comprising means for supporting at least one diode semiconductor device on at least one component of the assembly such that the axial force on said components from said means for forcing is not transmitted to said at least one diode semiconductor device.

* * * * *